(12) United States Patent
Lemke et al.

(10) Patent No.: US 6,241,535 B1
(45) Date of Patent: Jun. 5, 2001

(54) LOW PROFILE CONNECTOR

(75) Inventors: Timothy A. Lemke, Dillsburg; Timothy W. Houtz, Etters, both of PA (US)

(73) Assignee: Berg Technology, Inc., Reno, NV (US)

( * ) Notice: Subject to any disclaimer, the term of this patent is extended or adjusted under 35 U.S.C. 154(b) by 0 days.

(21) Appl. No.: 09/284,190

(22) PCT Filed: Oct. 9, 1997

(86) PCT No.: PCT/US97/18308

§ 371 Date: Jun. 7, 1999

§ 102(e) Date: Jun. 7, 1999

(87) PCT Pub. No.: WO98/15990

PCT Pub. Date: Apr. 16, 1998

Related U.S. Application Data (63) Continuation-in-part of application No. 08/777,806, filed on Dec. 31, 1996, and a continuation-in-part of application No. 08/728,194, filed on Oct. 10, 1996, now Pat. No. 6,024,584.
(60) Provisional application No. 60/027,611, filed on Oct. 10, 1996.

(51) Int. Cl.[7] ................................................... H01R 12/00

(52) U.S. Cl. .............................................. 439/83; 439/74

(58) Field of Search ................................ 439/83, 876, 74, 439/284, 293, 295, 856, 857

(56) References Cited

U.S. PATENT DOCUMENTS

| | | | |
|---|---|---|---|
| 2,231,347 | 2/1941 | Reutter | 439/597 |
| 2,980,881 | 4/1961 | McKee | 439/682 |
| 3,320,658 | 5/1967 | Bolda et al. | 29/155.5 |
| 3,719,981 | 3/1973 | Steltz | 29/423 |
| 3,838,382 | 9/1974 | Sugar | 439/595 |

(List continued on next page.)

FOREIGN PATENT DOCUMENTS

| | | | |
|---|---|---|---|
| 39 36 414 A1 | 11/1989 | (DE) | |
| 0 591 772 A1 | 4/1994 | (EP) | H01R/23/72 |
| 0 706 240 A1 | 4/1996 | (EP) | H01R/23/27 |
| 0 782 220 A2 | 7/1997 | (EP) | H01R/23/00 |
| 0 843 383 A2 | 5/1998 | (EP) | H01R/9/09 |
| 0072663 | 4/1985 | (JP) | |
| 0278893 | 11/1990 | (JP) | |
| 97/20454 | 6/1997 | (WO) | H05K/7/10 |
| 97/45896 | 12/1997 | (WO) | H01R/9/09 |

OTHER PUBLICATIONS

Research Disclosure, Aug. 1990, No. 316, Kenneth Mason Publications Ltd., England.

Research Disclosure, Oct. 1992, No. 342, Kenneth Mason Publications Ltd., England.

(List continued on next page.)

*Primary Examiner*—Tulsidas Patel
(74) *Attorney, Agent, or Firm*—Brian J. Hamilla; M. Richard Page (57) ABSTRACT

An electrical connector having a connector body with a passage extending from an interface portion toward a mounting portion; a conductive terminal having a base section secured in the passage and a tab adjacent the mounting interface; and an opening through the terminal at a location within the body to provide a thermal break for retarding the flow of liquid solder along said terminal. A method of making an electrical connector, comprising the steps of: inserting a contact in a passage of a connector body to a generally fixed position, a void existing between the contact and a wall defining the passage and adjacent a mounting interface; and reflowing a fusible element to attach to the contact and to fill the void. A method of retaining a contact within a body of an electrical connector, comprising the steps of: inserting a contact into an aperture in a connector body; limiting entry of the contact into the aperture; and reflowing a fusible element to attach to the contact. The fusible element prevents removal of the contact from the body.

13 Claims, 5 Drawing Sheets

U.S. PATENT DOCUMENTS

| | | | |
|---|---|---|---|
| 3,864,004 | 2/1975 | Friend | 439/844 |
| 3,865,462 | 2/1975 | Cobaugh et al. | 439/682 |
| 3,889,364 | 6/1975 | Krueger | 29/854 |
| 4,056,302 | 11/1977 | Braun et al. | 439/709 |
| 4,097,266 | 6/1978 | Takahaski et al. | 75/0.5 R |
| 4,140,361 | 2/1979 | Sochor | 439/856 |
| 4,217,024 | 8/1980 | Aldridge | 439/682 |
| 4,380,518 | 4/1983 | Wydro | 264/13 |
| 4,395,086 | 7/1983 | Marsh | 439/48 |
| 4,396,140 | 8/1983 | Jaffe et al. | 228/123 |
| 4,462,534 | 7/1984 | Bitaillou et al. | 228/180 |
| 4,482,937 | 11/1984 | Berg | 361/413 |
| 4,641,426 | 2/1987 | Hartman et al. | 29/839 |
| 4,664,309 | 5/1987 | Allen et al. | 228/180 |
| 4,678,250 | 7/1987 | Romine et al. | 439/83 |
| 4,705,205 | 11/1987 | Allen et al. | 228/180 |
| 4,722,470 | 2/1988 | Johary | 228/180 |
| 4,767,344 | 8/1988 | Noschese | 439/83 |
| 4,830,264 | 5/1989 | Bitalilloou | 228/180.2 |
| 4,871,110 | 10/1989 | Fukasawa et al. | 228/245 |
| 4,884,335 | 12/1989 | McCoy et al. | 29/839 |
| 4,904,212 | 2/1990 | Durbin et al. | 439/751 |
| 5,024,372 | 6/1991 | Altman et al. | 228/248 |
| 5,060,844 | 10/1991 | Behun et al. | 228/180 |
| 5,093,986 | 3/1992 | Mandal et al. | 29/843 |
| 5,098,311 | 3/1992 | Roaath et al. | 439/289 |
| 5,111,991 | 5/1992 | Clawson et al. | 228/180 |
| 5,118,027 | 6/1992 | Braun et al. | 228/180 |
| 5,120,237 | 6/1992 | Fusslee | 439/282 |
| 5,131,871 | 7/1992 | Banakis et al. | 439/751 |
| 5,145,104 | 9/1992 | Apap et al. | 228/179 |
| 5,169,320 | 12/1992 | Burkett, Jr. et al. | 439/66 |
| 5,199,885 | 4/1993 | Korsunsky et al. | 439/74 |
| 5,203,075 | 4/1993 | Angulas et al. | 29/830 |
| 5,207,372 | 5/1993 | Funari et al. | 228/180 |
| 5,222,649 | 6/1993 | Funari et al. | 228/6.2 |
| 5,229,016 | 7/1993 | Hayes et al. | 222/590 |
| 5,255,839 | 10/1993 | Alves et al. | 228/180 |
| 5,261,155 | 11/1993 | Angulas et al. | 29/830 |
| 5,269,453 | 12/1993 | Melton et al. | 228/180 |
| 5,275,330 | 1/1994 | Isaacs et al. | 228/180 |
| 5,284,287 | 2/1994 | Wilson et al. | 228/180.22 |
| 5,324,569 | 6/1994 | Nagesh et al. | 428/198 |
| 5,346,118 | 9/1994 | Degani et al. | 228/180.22 |
| 5,355,283 | 10/1994 | Marrs et al. | 361/760 |
| 5,358,417 | 10/1994 | Schmededing | 439/178 |
| 5,377,902 | 1/1995 | Hayes | 228/254 |
| 5,387,139 | 2/1995 | McKee et al. | 439/876 |
| 5,395,250 | 3/1995 | Englert et al. | 439/65 |
| 5,409,157 | 4/1995 | Nagesh et al. | 228/180.22 |
| 5,410,807 | 5/1995 | Brose et al. | 29/843 |
| 5,431,332 | 7/1995 | Kirby et al. | 228/246 |
| 5,435,482 | 7/1995 | Variot et al. | 228/254 |
| 5,442,852 | 8/1995 | Danner | 29/843 |
| 5,445,313 | 8/1995 | Boyd et al. | 228/248.1 |
| 5,462,456 | 10/1995 | Howell | 439/733.1 |
| 5,467,913 | 11/1995 | Namekawa et al. | 228/41 |
| 5,477,933 | 12/1995 | Nguyen | 174/262 |
| 5,489,750 | 2/1996 | Sakemi et al. | 174/261 |
| 5,491,303 | 2/1996 | Weiss | 174/262 |
| 5,492,266 | 2/1996 | Hoebener et al. | 228/248.1 |
| 5,495,668 | 3/1996 | Furusawa et al. | 29/874 |
| 5,498,167 | 3/1996 | Seto et al. | 439/74 |
| 5,499,487 | 3/1996 | McGill | 53/473 |
| 5,504,277 | 4/1996 | Danner | 174/261 |
| 5,505,629 | * 4/1996 | Majima et al. | 439/500 |
| 5,516,030 | 5/1996 | Denton | 228/180.22 |
| 5,516,032 | 5/1996 | Sakemi et al. | 228/246 |
| 5,518,410 | 5/1996 | Masami | 439/71 |
| 5,519,580 | 5/1996 | Natarajan et al. | 361/760 |
| 5,534,127 | 7/1996 | Sakai | 205/125 |
| 5,539,153 | 7/1996 | Schwiebert et al. | 174/260 |
| 5,542,174 | 8/1996 | Chiu | 29/840 |
| 5,593,322 | 1/1997 | Swamy et al. | 439/660 |
| 5,692,920 | * 12/1997 | Banakis et al. | 439/876 |

OTHER PUBLICATIONS

IBM Technical Disclosure Bulletin, vol. 20, No. 2 (Jul. 1977).

IBM Technical Disclosure Bulletin, vol. 32, No. 11, (Apr. 1990).

IBM Technical Disclosure Bulletin, vol. 14, No. 8 (Jan. 1972).

Berg Electronics Catalog, p. 13–96, Solder Washers.

Philip C. Kazmierowicz, "The Science Behind Conveyor Oven Thermal Profiling" KIC Oven.

Profiling, from Feb. 1990 issue of *Surface Mount Technology*.

Alphametals, Micro Electronic Interconnects.

European Search Report EP 97 91 2699 dated Nov. 1, 1999.

* cited by examiner

LOW PROFILE CONNECTOR

CROSS REFERENCE TO RELATED APPLICATION

This application is a continuation-in-part of U.S. patent application Ser. No. 08/777,806, filed Dec. 31, 1996 and entitled "Stress Resistant Connector and Method for Reducing Stress in Housing Thereof"; and U.S. patent application Ser. No. 08/728,194 filed Oct. 10, 1996 entitled "High Density Connector", now U.S. Pat. No. 6,024,584.

This application claims the priority of U.S. Provisional patent application Ser. No.60/027,611, filed Oct. 10, 1996 entitled "Low Profile Array Connector".

This application is also related to U.S. patent application Ser. No. 08/777,579, entitled "High Density Connector"; Ser. No. 08/778,380, entitled "Method for Manufacturing High Density Connector"; and U.S. patent application Ser. No. 08/778,398, entitled "Contact for Use in an Electrical Connector", all filed on December 31, 1996. The disclosures of the above identified applications are incorporated herein by reference.

BACKGROUND OF THE INVENTION

1. Field of the Invention

The present invention relates to electrical connectors and more particularly to high I/O density connectors, having a low mated height.

2. Brief Description of Prior Developments

The drive to reduce the size of electronic equipment, particularly personal portable devices, and to add additional functions to such equipment, has resulted in an ongoing drive for miniaturization of all components, especially electrical connectors. Efforts to miniaturize connectors have included reducing the pitch between terminals in single or double row linear connectors, so that a relatively high number of I/O or other lines can be interconnected by connectors that fit within tightly circumscribed areas on the circuit substrates allotted for receiving connectors. The drive for miniaturization has also been accompanied by a shift in preference to surface mount techniques (SMT) for mounting components on circuit boards. The confluence of the increasing use of SMT and the required fine pitch of linear connectors has resulted in approaching the limits of SMT for high volume, low cost operations. Reducing the pitch of the terminals increases the risk of bridging adjacent solder pads or terminals during reflow of the solder paste.

To satisfy the need for increased I/O density, array connectors have been proposed. Such connectors have a two dimensional array of terminals mounted on an insulative substrate and can provide improved density. However, these connectors present certain difficulties with respect to attachment to the circuit substrates by SMT techniques because the surface mount tails of most, if not all, of the terminals must be beneath the connector body. As a result, the mounting techniques used must be highly reliable because it is difficult to visually inspect the solder connections or repair them, if faulty.

In the mounting of an integrated circuit (IC) on a plastic or ceramic substrate the use of ball grid array (BGA) and other similar packages has become common. In a BGA package, spherical solder balls attached to the IC package are positioned on electrical contact pads of a circuit substrate to which a layer of solder paste has been applied, typically by use of a screen or mask. The unit is then heated to a temperature at which the solder paste and at least a portion or all of the solder ball melt and fuse to an underlying conductive pad formed on the circuit substrate. The IC is thereby connected to the substrate without need of external leads on the IC.

While the use of BGA and similar systems in connecting an IC to a substrate has many advantages, a corresponding means for mounting an electrical connector or similar component on a printed wiring board (PWB) or other substrate has become desirable. It is important for most situations that the substrate-engaging surfaces of the solder balls are coplanar to form a substantially flat mounting surface, so that in the final application the balls will reflow and solder evenly to a planar printed circuit board substrate. Any significant differences in solder coplanarity on a given substrate can cause poor soldering performance when the connector is reflowed onto a printed circuit board. To achieve high soldering reliability, users specify very tight coplanarity requirements, usually on the order of 0.004 to 0.008 inches (or 0.1016 mm to 0.2032 mm). Coplanarity of the solder balls is influenced by the size of the solder ball and its positioning on the connector. The final size of the ball is dependent on the total volume of solder initially available in both the solder paste and the solder balls. In applying solder balls to a connector contact, this consideration presents particular challenges because variations in the volume of the connector contact received within the solder mass affect the potential variability of the size of the solder mass and therefore the coplanarity of the solder balls on the connector along the mounting surface.

Another problem presented in soldering connectors to a substrate is that connectors often have insulative housings which have relatively complex shapes, for example, ones having numerous cavities. Residual stresses in such thermoplastic housings can result from the molding process, from the build up of stress as a result of contact insertion, or a combination of both. These housings may become warped or twisted either initially or upon heating to temperatures necessary in SMT processes, such as temperatures necessary to reflow the solder balls. Such warping or twisting of the housing can cause a dimensional mismatch between the connector assembly and the PWB, resulting in unreliable soldering because the surface mounting elements, such as solder balls, are not sufficiently in contact with the solder paste or close to the PWB prior to soldering. The parent and related applications previously identified are directed to solutions to these design challenges. The drive for reduced connector size relates not only to footprint dimensions but also to mated connector height. As electrical equipment shrinks in size, the necessity arises for stacking circuit boards closer together. This invention concerns high density connectors, particularly low profile connectors for reducing the spacing between stacked circuit boards, and more particularly connectors utilizing ball grid array attachment techniques.

SUMMARY OF THE INVENTION

Electrical connectors according to the present invention provide high I/O density and reduced stacking height.

Mated connector height is reduced by utilization of recessed areas in the mating interface of one connector body for receiving the distal portion of a terminal associated with a mating connector. Reduced mated connector height is also achieved by providing a relief area in the connector body to allow flexure of the lower sections of the contact arms of the contact terminal.

Overall contact length is reduced by extending cantilevered receptacle contact arms beyond a bight in the terminal toward a plug contact having a relatively short retention base. Both the plug and receptacle contact terminals are received in a passage having a retention feature that engages the contact terminal centrally, thereby allowing a maximization of beam length and the achievement of acceptable performance characteristics. Contact terminal retention features may be located at an intermediate location along the length of one or more of the contact arms.

Thermal breaks may be placed in the retention section of the contact terminal. The breaks control solder wicking along the terminal from a mounting surface, where a body of fusible material is formed on the terminal.

Contact terminals may be retained in the connector body by a projection or projections in the terminal retention passage that engage the retention section of the terminal or an opening formed in the retention section of the terminal. This terminal mounting arrangement minimizes the accumulation of stress in the connector body, thereby reducing the tendency of the molded connector body to bow or warp.

BRIEF DESCRIPTION OF THE DRAWINGS

The method and connector of the present invention is further described with reference to the accompanying drawings in which.

DETAILED DESCRIPTION OF THE PREFERRED EMBODIMENTS

Figure 1:
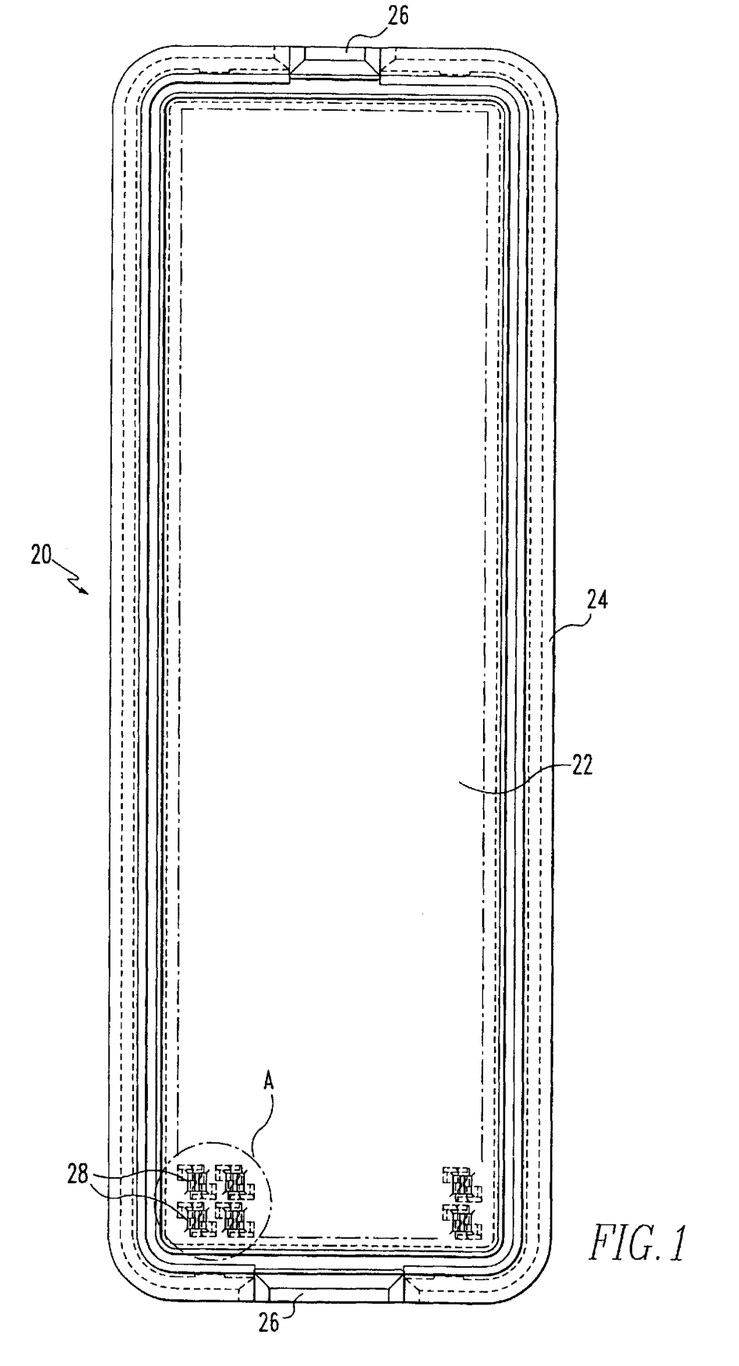
FIG. 1 is a top plan view of a plug connector embodying the present invention.

FIG. 1 shows a plug connector 20 having a connector body or housing comprising a substantially planar base member 22 and a surrounding peripheral wall 24. On each end wall there are polarizing/alignment tabs 26 upstanding from the wall 24 to assure proper mating of the plug connector 20 with its companion receptacle connector 52, described later. Preferably the connector body is formed as an integral one piece part by molding an insulative polymer. Preferably, the polymer is one capable of withstanding SMT (Surface Mount Technology) reflow temperatures, for example, a liquid crystal polymer.

The plug connector 20 includes an array of plug contact terminals 28 that are retained in a desired pattern, such as a two dimensional matrix, on the connector body. For purposes of simplicity of the drawing, only a few of the terminal sites are shown.

Figure 3:
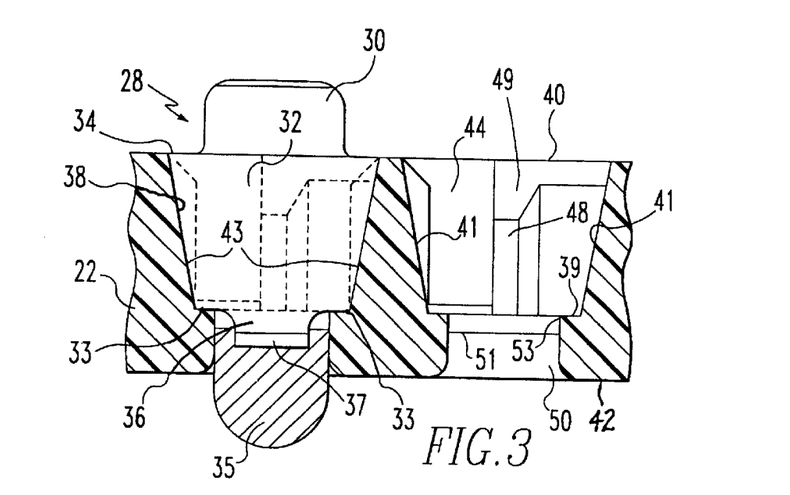
FIG. 3 is a cross section of the area shown in FIG. 2 taken in the direction of line 3—3.

Referring to FIG. 3, each plug terminal 28 comprises a substantially planar contact terminal having a mating section 30 for mating with a receptacle contact terminal 72, to be later described. Plug terminal 28 also includes a retention section 32 adapted to be retained in the connector body 22 in a manner that will hereinafter be described. The retention section 32 includes a pair of opposed shoulders 34 against which an insertion tool is applied to insert the terminal 28 into a terminal passage 38 formed in the connector body 22. Burrs or barbs can also be formed at shoulders 34 to aid in retention of the terminal in the passage 38. A solder tab 36 extends from the retention section 32 through slot-shaped opening 53 at the bottom of the passage 38 and is adapted to have a fusible substrate contact mass or body, such as solder ball 35, fused thereon. Preferably, the lead edge of the solder tab is beveled toward its tip on one or both sides of the terminal, as by chamfer or bevel 37. Solder balls 35 are fused onto plug terminals 28 and receptacle terminals 72 (described later) by techniques described in parent applications Ser. Nos. 08/778,806 and 08/728,194.

As illustrated in FIG. 3, the contact terminal 28 is retained in the terminal passage 38 formed in the connector body 22. The passage 38 extends from a mating interface or surface 40 toward a mounting surface 42. A recess such as a well or pocket 50 is formed in the mounting surface 42 in alignment and communication with each passage 38 through slot opening 53. The mating contact section 30 extends from the mating interface 40 and the solder tab 36 extends into the pocket 50. The terminal 28 is positioned substantially in alignment with a medial plane MP (FIG. 2) of the passage 38.

The terminal contacts 28 are secured in the body 22 in a manner to avoid the inducing of stress into the molded plastic body upon insertion of the terminals. This objective is achieved in the preferred embodiment by the utilization of the opposed projections 48. A lead-in surface 49 is formed at the top of each projection 48. The distance between the distal portions of the projections 48 is less than the thickness of the metal terminal 28 thereby creating an interference fit. Thus the distal portion of each projection 48 is engaged and deformed by the contact terminal as the terminal 28 is inserted into the passage 38 and slot 53. Preferably, the distal positions of projections 48 are spaced equidistant from the medial plane MP, so that there is substantially equal amounts of deformation of each projection upon insertion of the terminal. As a result, the normal forces against terminal retention section 32 are substantially balanced, thereby aiding in alignment along medial plane MP. The contact terminal is securely held in the passage 38 and slot 53 by the normal force exerted on the contact terminal by the deformed projections. The lead-in surfaces 49 and beveled tips 37 reduce the likelihood of skiving of the projection 48 during insertion, thereby minimizing the removal of material from the projection 48. The distal portion of each projection deforms and develops a retention force, but one that is localized, so that accumulation of stresses in the housing is avoided. The provision of a pair of opposed, substantially identical projections 48, equidistant from medial plane MP aids in close tolerance positioning of the contact terminal 28 along the medial plane MP.

One of the advantages of the terminal retention structure illustrated in FIG. 3 and disclosed in the above noted parent applications is believed to arise from the situation that after reflow to attach the solder ball 35 to the terminal 28, the terminal is secured in housing 22 in a locked condition under close to "zero clearance" conditions. This results from the following conditions. The terminal 28 is "bottomed" in passage 38 by inserting the terminal until bottom shoulders 33 engage passage bottom surfaces 39. This locates the terminal 28 in a vertical downward position, with respect to the view of FIG. 3. After reflow to attach the solder mass 35 onto tab 36, by techniques described, for example, in parent application Ser. Nos. 08/728,194 and 08/778,806, the solder ball and/or solder paste disposed in pocket 50 form a mass that fills and conforms to the shape of the pocket 50. As a result the solder mass 35 engages the bottom 51 of the well 50. Thus, the reflowed solder mass 35 serves to prevent movement of the terminal 28 upward (in the FIG. 3 sense) out of passage 38.

Figure 2:
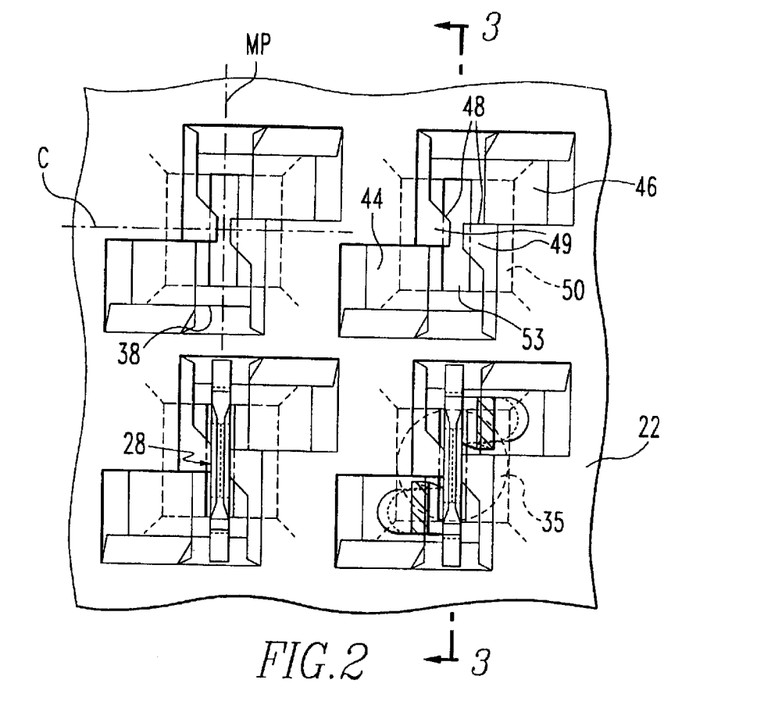
FIG. 2 is an enlarged view of the area A of the plug shown in FIG. 1.

The terminal 28 is located in side to side directions by engagement of side edges 43 of the retention section 32 against the lateral side walls 41 of the passage 38. Preferably side walls 41 and side edges 43 have a matching taper, as shown, to aid in true positioning of terminal 28. Turning to FIG. 2, the terminal 28 is held centrally positioned within passage 38 (in the left to right directions in FIG. 2) by the opposed projections 48. This results in the location of terminal 28 in housing 22 under tolerance conditions that approach tolerances achieved in insert molding. The improved overall, achievable tolerance levels result from minimization of clearances that are normally present when metal terminals are post-inserted into a plastic housing. That is, positional tolerances are lessened, leaving fit tolerances (the tolerances between mating connectors) as the principal tolerance to be accommodated in the parts. The terminal pitch is maintained during insertion as if the terminals are still mounted on a carrier strip. The close pitch tolerance achieved during the terminal blanking operations is substantially maintained after terminal insertion, by employment of the contact retention system disclosed above.

While the cross sectional shape of the projections 48 shown in FIGS. 2 and 3 is preferred, projections or ribs of somewhat different shape and size may be employed. An explanation of the mechanism of this retention system is described in parent application Ser. Nos. 08/728,194 and 08/778,806. The deformation of the projections 48 by the terminals 28 create frictional forces sufficient to hold the position of the terminals in the housing prior to reflow of the solder balls 35.

Figure 4:
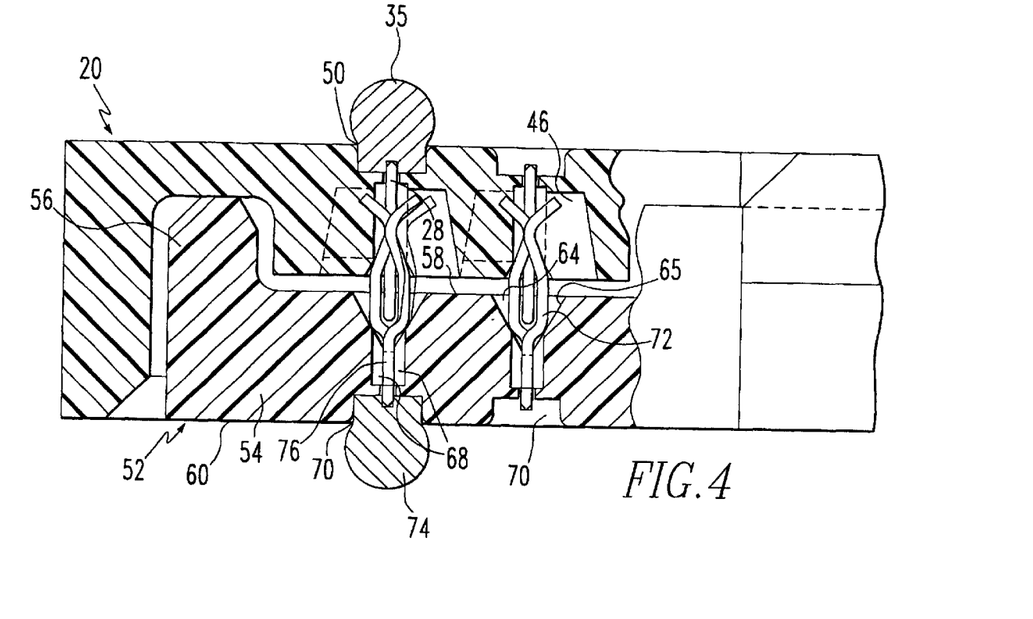
FIG. 4 is a partially cut away cross sectional view of the plug element shown in FIGS. 1–3 mated with a receptacle.
Figure 5:
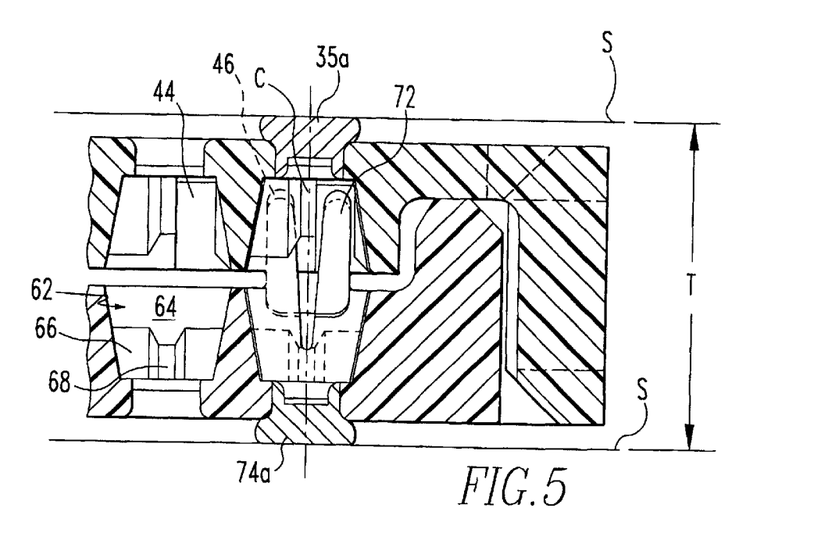
FIG. 5 is a partially cut away cross sectional view of the receptacle and plug shown in FIG. 4 in an orientation normal to that shown in FIG. 4 and mounted between stacked circuit substrates.

Adjacent each of the passages 38 are one or more tip receiving recesses 44, 46 that are adapted to receive the distal portions of mating receptacle contact terminals 72. As shown, the recesses 44, 46 are formed with one side contiguous with the passages 38. In the embodiment shown in FIGS. 2 and 3, the recesses are on opposite sides of the medial plane MP. These recesses are also laterally offset from each other, that is, they are on opposite sides of a central plane C that is orthogonal to the medial plane MP. FIGS. 4 and 5, show the distal portions of contact arms of the receptacle contact terminal 72 received in recesses 44, 46.

Referring to FIGS. 4 and 5, a receptacle connector 52 for mating with the plug connector 20 is illustrated. The receptacle connector 52 includes a body 54, preferably formed of the same insulative molded polymer as plug connector 20. Surrounding the body 54 is a peripheral wall 56, that includes cut out regions (not shown) for receiving the polarizing/locating tabs 26 of the plug connector. The base or body member 54 includes receptacle passages 62 for receiving of receptacle terminals 72. When utilizing receptacle terminals of the type illustrated in FIGS. 6, 7 and 8, the passages 62 preferably include opposed relief areas 64 for accommodating receipt of plug terminal 28 in the formed contact arms 78a, 78b (FIGS. 4 and 5). The relief areas 64 are preferably formed with lead-in surfaces 65 that extend and include the top portions of the projections 68. The passages 62 also include side walls 66. Opposed terminal retention projections 68 extend from the side walls 66 toward base sections 76 (FIGS. 6 and 7) of the receptacle terminals 72. The projections 68 are deformed upon insertion of the receptacle terminals 72 in the same manner as described above with respect to the projections 48 in the plug connector 20. The chamfer 87 of tips 88 and lead-in surfaces 65 aid in achieving deformation rather than removal of the distal portions of the projections 68, as previously described in connection with FIG. 3.

Each receptacle passage 62 extends from the mating interface 58 of body 54 to a well or pocket 70 formed in the mounting interface or surface 60. As shown in FIG. 4, the pocket 70 are adapted to receive a substrate contact mass, such as solder balls 74 that are fused to the terminals 72 and substantially fill and conform to the shape of the pocket 70. Thus the receptacle terminals are retained and located substantially in the same manner as plug terminals 28.

As illustrated in FIG. 5, the configurations of the plug and connector bodies 22 and 54 and the configurations of the plug contact terminals 28 and receptacle contact terminals 72 allow minimization of the height of the mated connectors. This in turn allows the stacking height T between stacked circuit substrates S to be minimized after a second reflow of the solder balls 35a and 74a.

Figure 6:
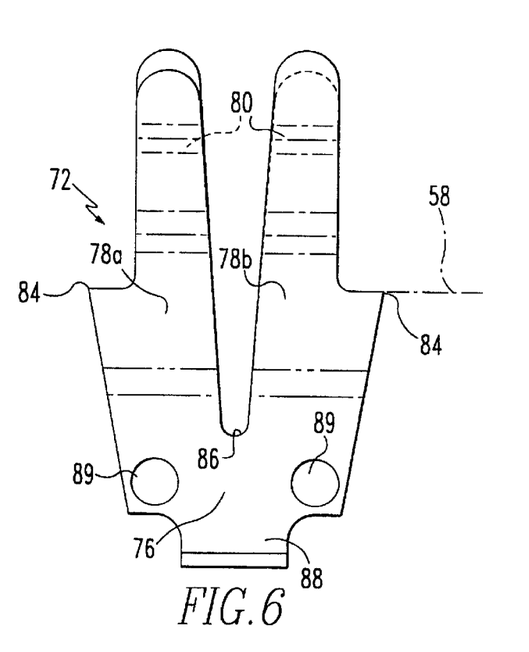
FIG. 6 is an elevational view of the receptacle contact terminal shown in FIGS. 4 and 5.
Figure 7:
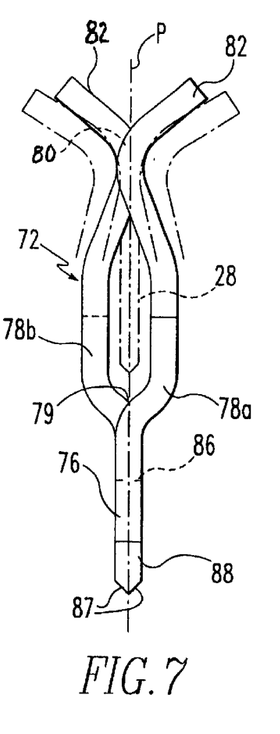
FIG. 7 is a side view of the receptacle contact terminal shown in FIG. 6.
Figure 8:
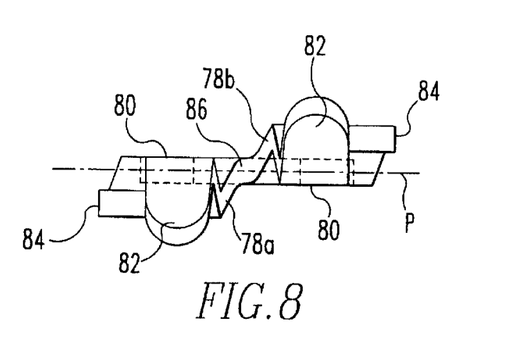
FIG. 8 is a top view of the receptacle contact terminal shown in FIGS. 6 and 7.

Turning now to FIGS. 6–8, a preferred form of receptacle terminal 72 is described in further detail. Each receptacle contact terminal includes a base portion 76 and a pair of cantilevered spring contact arms 78a, 78b. As shown in FIG. 7, the base portion 76 is substantially planar and can be considered as defining a longitudinally extending central plane P of the contact. As shown in FIG. 7, each of the contact arms 78a, 78b diverges oppositely from the plane P in the central region of the contact arms to form between them a bight 79, which is spaced from the bottom 86 of the gap located between the two contact arms.

The distal portions of the arms 78a, 78b then converge toward the plane P to form contact sections 80 for engaging the plug terminals. Lead-in portions 82 are formed at the ends of the arms 78a, 78b to aid in mating with the plug contact 28. A sharp shoulder 84 is formed intermediate the ends of each of the arms 78a, 78b. The sharp shoulder acts as a barb to aid in retention of the terminal within the passage 62. These shoulders, as well as the shoulders 34 of plug contacts 28 are engaged by tooling to insert the metal contacts into the respective plastic bodies. The sharp corners aid in retaining the terminals in the respective passages.

The use of the laterally offset contact arms 78a, 78b provides numerous advantages including minimization of the front-to-back dimension of the terminal, even when deflected to the phantom line position shown in FIG. 7 by the entry of the plug contact 28 between the two arms 78a, 78b. Further, the utilization of the terminal retention projections 68 as shown in FIGS. 4 and 5 allows a maximization of the length of the contact arm 78a, 78b thereby allowing the development of suitable amounts of deflection to generate appropriate contact normal forces and sufficient contact wipe.

Figure 9:
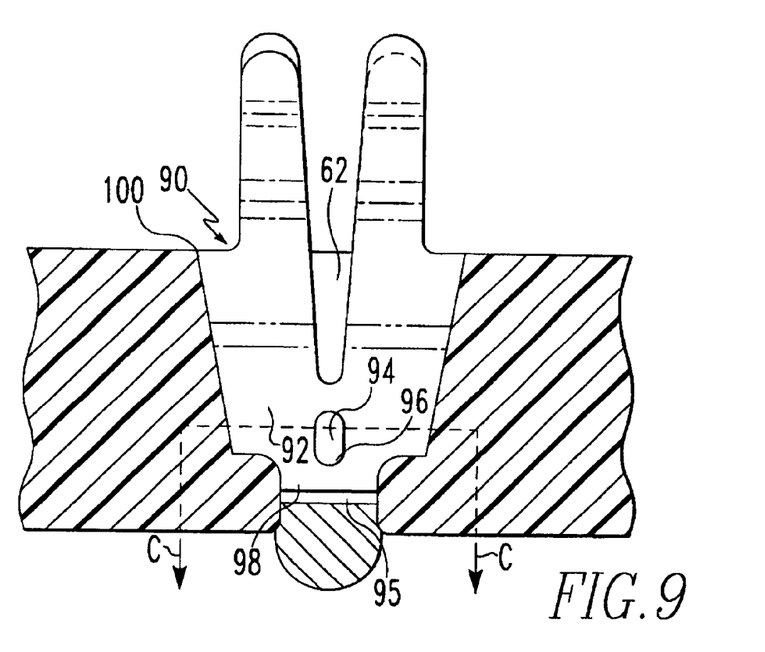
FIG. 9 is an elevational view of a second embodiment of the receptacle contact terminal.
Figure 10:
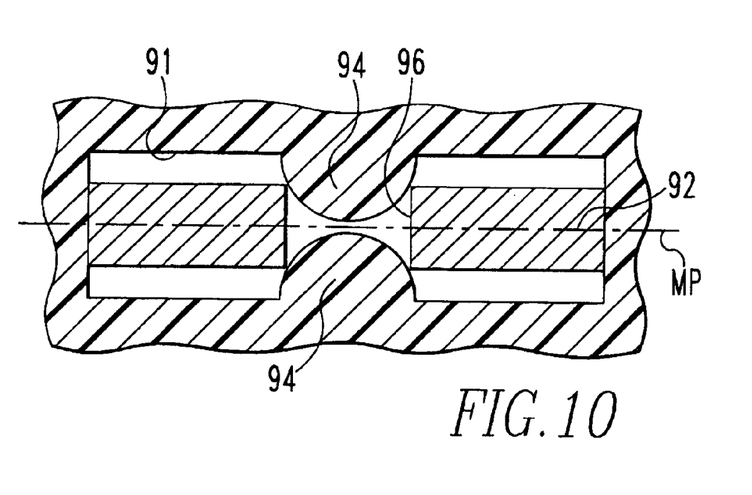
FIG. 10 is a cut away cross sectional view along line C—C of FIG. 9 of the retention section of the contact terminal retained in a passage.

As shown in FIG. 6, a solder tab 88 projects from the base section 76. In a preferred form, the solder tab 88 is adapted to have a solder ball fused onto it. As previously discussed in connection with plug terminal 28, the leading edge of the terminal 72 is provided with appropriate lead-in structure, such as chamfered surfaces 87. The base section may be provided with thermal break structure to minimize solder wicking from the pocket 70 onto the terminal. As shown in FIG. 6, the thermal break structure can comprise a pair of openings 89. This structure may be used in conjunction with the formation of a passivated surface on base section 76 or the application of other appropriate anti-solder wicking coatings, such as organo-fluoro polymers known the art. The thermal breaks, with or without passivation and/or anti-wicking coatings, retard the flow of solder along the contact, when solder paste in pocket 70 is reflowed to secure the solder ball 74 on the solder tab 88. The plug terminal 28 may also include such anti-solder wicking adjuncts as thermal breaks, passivation, coatings or a combination thereof. Referring to FIGS. 9 and 10, an alternative structure is shown for retaining terminals, such as the receptacle contact terminals 90 in a connector housing. In this embodiment, passages 91 are formed to receive the terminals 90. Within each of the passages 91, one or more projections 94 are formed to extend from the side walls of the passage. Each terminal has an opening 96 that is sized and shaped to receive at least a portion of one or both of the projections 94. Ideally, the shape of the opening 96 corresponds to the shape of the projections 94, so that the terminal is constrained by the projections against sideways and longitudinal movement, as well as front to back movement. The distal portions of the projections 94 are spaced apart a distance less than the thickness of the material from which the terminal 90 is formed and preferably equidistant from the medial plane MP.

Upon insertion of the terminal 90 into the passage 91, the projections 94 are deformed or spread slightly by the terminal tip or solder tab 98. The beveled or chamfered surface 95 reduces the tendency of the solder tab 98 to skive the distal portions of the projections 94. When the terminals are in a fully inserted position, the projections 94 are aligned with the opening 96 and the distal portions thereof enter the opening 96. As a result, any stress imparted on the connector body is localized to the distal regions of the projections 94. Because a significant portion of the stress is relieved when the projections 94 enter opening 96, there is avoidance of stress build up that could cause warpage or bowing of the connector body. Preferably, the longitudinal cross section of retention section 92 is substantially symmetrical about a central longitudinal plane, so that there is a self-centering action imposed on the contact terminal 90 as the base 92 is inserted into the passage 91. The opening 96 also can function as a thermal break to retard solder wicking, in the same manner as openings 89 in the FIG. 6 embodiment. The terminal 90 may also include passivation or anti-wicking coatings to prevent solder flow toward the contact sections.

While the present invention has been described in connection with the preferred embodiments of the various figures, it is to be understood that other similar embodiments may be used or modifications and additions may be made to the described embodiment for performing the same function of the present invention without deviating therefrom. Further, the arrangements described can be used with respect to components other than connectors, that comprise housings formed of insulative materials which carry elements to be fused onto a PWB or other electrical substrate.

Therefore, the present invention should not be limited to any single embodiment, but rather construed in breadth and scope in accordance with the recitation of the appended claims.

What is claimed is:

1. An electrical connector, comprising:
a connector body having a terminal interface portion and a mounting portion;
a passage extending from said interface portion toward the mounting portion;
a conductive terminal having a base section secured in the passage and a tab adjacent said mounting portion; and
an opening through said terminal at a location within said body to provide a thermal break for retarding the flow of liquid solder along said terminal.

2. A method of making an electrical connector, comprising the steps of:
providing a connector body having a passage therethrough and a mounting interface;
providing a contact;
inserting said contact in said passage and towards said mounting interface to a generally fixed position, wherein a void exists between said contact and at least one wall defining said passage and adjacent said mounting interface;
providing a fusible element; and
reflowing said fusible element to attach said fusible element to said contacts to fill said void, and to prevent removal of said contact from said passage.

3. The method as recited in claim 2, wherein the reflowing step fills substantially all of said void.

4. The method as recited in claim 2, wherein the insertion step limits the longitudinal location of said contact in said passage.

5. The method as recited in claim 4, wherein the insertion step limits the lateral location of said contact in said passage.

6. The method as recited in claim 2, further comprising the step of mounting the connector to a substrate by reflowing said fusible element.

7. The method as recited in claim 6, wherein the mounting step occurs subsequent to the reflowing step.

8. An electrical connector, comprising:
a connector body having a passage therethrough and a mounting interface;
a contact inserted into said passage towards said mounting interface and located at a generally fixed position, wherein a void exists between said contact and at least one wall defining said passage and adjacent said mounting interface; and
a conductive element fused to said contact, generally filling said void, and preventing removal of said contact from said passage.

9. The electrical connector as recited in claim 8, wherein said conductive element completely fills said void.

10. A method of retaining a contact within a body of an electrical connector, comprising the steps of:
providing an electrical connector having a body with an aperture therethrough:
providing a contact;
inserting said contact into said aperture from a first side of said connector;
limiting entry of said contact into said aperture:
providing a fusible element: and
reflowing said fusible element to attach said fusible element to said contact at a second side of said connector, said first side different than said second side, said fusible element preventing removal of said contact from said body.

11. The method as recited in claim 10, wherein the electrical connector providing step includes providing said aperture with a surface, said surface performing the limiting step.

12. The method as recited in claim 10, wherein said first side of said connector is opposite said second side of said connector.

13. A method of retaining a contact within a body of an electrical connector, comprising the steps of:

provid ing an electrical connector having a body with an aperture therethrough, wherein said connector receives a mating connector in a mating direction;

providing a contact;

inserting said contact into said aperture in said mating direction;

limiting entry of said contact into said aperture;

providing a fusible element; and reflowing said fusible element to attach said fusible element to said contact, said fusible element preventing removal of said contact from said body.

* * * * *